United States Patent [19]
DeCamp et al.

[11] Patent Number: 6,063,132
[45] Date of Patent: May 16, 2000

[54] METHOD FOR VERIFYING DESIGN RULE CHECKING SOFTWARE

[75] Inventors: William Frantz DeCamp, South Burlington, Vt.; Laurice Thorsen Earl, San Jose, Calif.; Jason Steven Minahan, Huntington, N.Y.; James Robert Montstream, Williston, Vt.; Daniel John Nickel, Westford, Vt.; Joseph James Oler, Jr., Jericho, Vt.; Richard Quimby Williams, Essex Junction, Vt.

[73] Assignee: International Business Machines Corporation, Armonk, N.Y.

[21] Appl. No.: 09/105,731

[22] Filed: Jun. 26, 1998

[51] Int. Cl.⁷ .................................................. G06F 15/18
[52] U.S. Cl. ........................................................ 716/5
[58] Field of Search .......................... 395/500.06, 500.2, 395/500.21, 183.14, 701

[56] References Cited

U.S. PATENT DOCUMENTS

| | | | |
|---|---|---|---|
| 4,464,655 | 8/1984 | Bird | 345/117 |
| 4,729,096 | 3/1988 | Larson | 395/705 |
| 5,113,451 | 5/1992 | Chapman et al. | 382/145 |
| 5,497,334 | 3/1996 | Russell et al. | 395/500.06 |
| 5,526,279 | 6/1996 | Dick | 395/500.2 |
| 5,537,648 | 7/1996 | Liebmann et al. | 395/500.2 |
| 5,613,102 | 3/1997 | Chiang et al. | 395/500.06 |
| 5,675,499 | 10/1997 | Lee et al. | 395/500.2 |
| 5,692,122 | 11/1997 | Bird | 714/38 |
| 5,740,041 | 4/1998 | Leipold | 395/500.12 |
| 5,754,826 | 5/1998 | Gamal et al. | 395/500.35 |
| 5,761,080 | 6/1998 | DeCamp et al. | 395/500.06 |
| 5,787,006 | 7/1998 | Chevallier et al. | 395/500.06 |
| 5,831,870 | 11/1998 | Folta et al. | 395/500.06 |
| 5,831,998 | 11/1998 | Ozmizrak | 714/741 |
| 5,923,562 | 7/1999 | Liebmann et al. | 395/500.2 |
| 5,923,566 | 7/1999 | Galan et al. | 395/500.22 |
| 5,978,940 | 11/1999 | Newman et al. | 714/712 |

OTHER PUBLICATIONS

Ries, W., "Rule–based Implementation of Correct and Efficient VLSI Design Rule Checking," International Workshop on Industrial Applications of Machine Intelligence and Vision, Apr. 1989, pp. 205–209.

Popescu, V. and McNamara, B., "Innovative Verification Strategy Reduces Design Cycle Time for High–end SPARC Processor," Proceedings of the 33rd Annual Conference on Design Automation, Jun. 1996, pp. 311–314.

(List continued on next page.)

*Primary Examiner*—Robert A. Weinhardt
*Assistant Examiner*—Margaret Joyce
*Attorney, Agent, or Firm*—Richard M. Kotulak

[57] ABSTRACT

A method using a generate-and-verify computer program product to generate by repetitive passes a design rules checking computer program, wherein the design rules are described in a file called a runset. The design rules checking program is used for exhaustive testing of VLSI chips for compliance to the design rules of a given VLSI fabrication process. The runset is repeatedly iterated in loop fashion with respect to a testcase file containing groups of layout structures or shapes used for verifying the correctness of the runset. A general purpose shapes processing program creates an error shapes file for storing geometrical errors found in each said layout structure. Two additional shapes are used in the verification process: user boundary shapes for defining areas in which errors are not to be detected for a given design rule, and automated boundary shapes created to surround each said layout structure with a boundary that defines regions where error shapes can occur. An association table is created which is a compilation of the error shapes, user boundary shapes, and automated boundary shapes associated with each layout structure. The association table is processed to determine the correctness of the runset. The runset is modified to correct each valid error. The repetitive passes continue until a final runset is generated. This final runset becomes the input to design rules checking computer program product and customizes the program for a given VLSI fabrication process.

30 Claims, 6 Drawing Sheets

OTHER PUBLICATIONS

McPherson, K. and Banerjee, P., "Integrating Task and Data Parallelism in an Irregular Application: A Case Study," 8th IEEE Symposium on Parallel and Distrubuted Processing, Oct. 1996, pp. 208–213.

Ming–Dou Ker, Sue–Mei Hsiao, and Jiann–Horng Lin, "Layout Verfication to Improve ESD/Latchup Immunity of Scaled–down CMOS Cell Libraries," Proceedings of the 10th Annual IEEE International ASIC Conference and Exhibit, Sep. 1997, pp. 125–129.

Russell, S. and Norvig, P., Artificial Intelligence A Modern Approach, pp. 531–540 and 544–552. Q335. R86 1995.

"Computer–aided Verification," *IEEE Spectrum,* vol. 33, No. 6, pp. 61–67, Jun. 1996.

METHOD FOR VERIFYING DESIGN RULE CHECKING SOFTWARE

FIELD OF THE INVENTION

The present invention relates to computer-aided testing for design verification of all very large scale integration (VLSI) physical designs including ASIC (Application specific integrated circuit) chips and other diagram-based designs including microprocessor, logic, and memory designs. More specifically, the present invention relates to verifying the correctness of the software file that checks the physical design of integrated circuit chips by checking that the geometrical layout and physical placement of the integrated circuits comply with the design rules of the specific VLSI fabrication process.

BACKGROUND OF THE INVENTION

In the design and manufacture of VLSI chips, it is conventional practice that the VLSI fabrication process has a set of physical design rules for placement, wiring, and geometrical layout of the chip. There is a requirement that every chip built in the VLSI fabrication process be checked to verify conformance with the design rules. Thus, design rules checking is provided to verify that geometric shapes of circuits are not placed so closely together within the chip that they will not work. Design rules include many other rules for proper chip design including circuit-to-circuit driving rules, orthogonal conflicts, tester limitations, and other parameters.

In the *IEEE Spectrum* of June 1996, pp 61–7, an article called "Computer-aided Verification" by E. M. Clark and R. P. Kurshan, the major importance of design verification before going to silicon is touted. A real example of problems that can occur with poor verification is the bug found in the floating point division circuitry of Intel Corporation's Pentium chip, which brought notoriety to the high cost that is incurred when a bug is committed to silicon. The article reports that some say the cost of the bug was $500 million. Clark and Kurshan report that behind every bug that makes the news, an uncounted number of chip errors go undetected throughout the design, implementation, and marketing phases of many products. These errors will finally be detected and require corrective measures in hardware, software, or subsequent releases. Such difficulties have spurred research into methods that attempt to prove a system correct before it is built in real hardware.

The debugging or most chips and many highly complex software systems is accomplished by an elaborate testing process involving extensive runs of computer models of the target implementation. However, finding and correcting errors before going to silicon can reduce correction costs by an order of magnitude. The problem is the tremendous magnitude of the number of tests required to verify the complex chips of the state-of-the-art architecture. With chips of this complexity, billions of tests are required. For this reason, researchers have sought design verification methods that are more limited in scope. One popular design verification approach subdivides the verification problem into entities that are more easily handled by creating separate design verification tools for checking logical functions of the design, timing of the design, design rules, etc. Thus, the design rule checking verification tool relating to the present invention is one individual aspect of the overall verification problem that is accomplished separately from the other computer-aided verification tests.

The present invention relates to design rule checking, which is one part of the larger computer-aided design verification field. Design rule checking (DRC) is the process of ensuring that Very Large Scale Integration (VLSI) masks for creating circuits and wiring on a chip are created according to the proper layout criteria. The layout criteria is usually described in detail in a manual relating to a specific fabrication process. DRC is an important part of any chip design, especially with today's aggressive performance targets. DRC must accurately reflect the VLSI fabrication process in order to avoid yield losses and nonfunctional parts.

Specific design rule checks verify the shape and shape size of various circuit components which are diffused, deposited, or etched onto a chip. Design rules checking also verifies the shapes are of the proper size, shape, and type, and are within the specified proximity to adjacent shapes. A usual name for the design rules checking software program is a general purpose shapes processing program (GPSPP). The GPSPP processes inputs from two files: runset and physical layout file. The runset is a command language input file that instructs the processor executing the GPSPP how to perform the design rule checks. The runset contains several hundred individual checks. In the prior art, the runset is typically assembled and tested manually. Creating runsets by hand can introduce two significant types of errors:

1. Missed errors—the runset does not flag an error condition that it should have flagged.
2. False errors—the runset flags non-existent error conditions.

The present invention automates a method for detecting whether a particular runset is missing errors or indicating false errors. The invention also facilitates the modification of an initial runset into a final runset which is corrected to eliminate both of the above errors. In addition, the method provides for verifying intentional pass and intentional fail shape configurations. Using this automated method, verifying DRC runset correctness is reduced from days to under an hour.

It is an object of the present invention to provide an automated method for establishing the correctness of a runset file which customizes a general purpose shapes processing program, such that when the runset is used for a design rules checking run all design rules violations will be detected.

It is a further object of the present invention to provide an automated method for establishing the correctness of each runset, such that the possibility is eliminated that the runset will falsely flag non-existent error conditions.

It is a further object of the present invention to provide a software methodology for verifying and debugging runsets to replace the prior art method of manually compiling the runsets.

It is a further object of the present invention to provide a system for classifying test cases using relationships that include intentional pass, intentional fail, unintentional pass, and unintentional fail configurations.

SUMMARY OF THE INVENTION

In accordance with the invention, an automated method and a generate-and-verify software methodology are provided for efficiently generating and verifying a design rules description file for use with a general purpose shapes processing program. Design rule checking is the process for ensuring that VLSI masks are created according to the proper layout criteria. Specific design rule checks verify shape size, type, and proximity to adjacent shapes. The design rules checking (DRC) software is comprised of a design rules description file, called a runset, which is provided in the form of an input file to a general purpose shapes processing program (GPSPP). The runset uses a command language that instructs the processor executing the GPSPP how to perform the design rule checks.

The generate-and-verify software methodology is called SHAPEDIFF and is provided for verifying that the runset is detecting design rule errors correctly and for providing the output information required for modifying the runset when it is not detecting all error conditions correctly. Initially the runset coding is taken from a general purpose runset file. The initial runset is used by the GPSPP to perform a design rules checking run on a testcase file, which is called a DRC run (the execution of the general purpose shapes processing program based on the runset and testcase input files). The DRC run checks each individual design rule against a series of testcases built into two categories: testcases designed to fail the design rules check and testcases designed to pass the design rules check. The testcase consists of groups of layout structures or shapes that individually exercise all the rules of the VLSI fabrication process. The DRC run creates a file of error shapes which defines the layout structures in the testcase that the runset found to be in error. SHAPEDIFF receives as inputs the error shapes file, the testcase file, and the runset file, and provides the output information required for modifying the runset to customize the design rules descriptions for a given VLSI fabrication process.

Disclosed is a method using a generate-and-verify computer program to generate the modified runset file by repetitive passes though the GPSPP and SHAPEDIFF programs. The runset is used with a general purpose shapes processing program for exhaustive testing of VLSI chips for compliance to the design rules of a given VLSI fabrication process. The runset is repeatedly executed in loop fashion with respect to a testcase file containing groups of layout structures or shapes used for verifying the correctness of the runset. The GPSPP creates an error shapes file for storing geometrical errors found in each said layout structure. Two additional shapes are used in the verification process: user boundary shapes for defining areas in which errors are not to be detected for a given design rule, and automated boundary shapes created to surround each said layout structure with a boundary that defines regions where error shapes can occur. An association table is created by SHAPEDIFF which is a compilation of the error shapes, user boundary shapes, and automated boundary shapes associated with each layout structure. The association table is processed to determine if each error shape is a valid error or not. Errors are categorized into five categories: intentional fail, intentional pass, unintentional fail, unintentional pass, and missing boundary shape. The runset is modified to correct unintentional fails, unintentional passes, and missing boundary conditions. The repetitive passes continue until a modified runset has no unintentional fails, no unintentional passes, and no missing boundaries. This final runset becomes the runset file for the given VLSI fabrication process.

The advantages of this invention will become apparent from the following detailed description of the presently preferred embodiment of the invention taken in conjunction with the accompanying drawings.

DETAILED DESCRIPTION OF PREFERRED EMBODIMENT OF THE INVENTION

In accordance with the invention, an automated method and a generate-and-verify software methodology are provided for efficiently generating and verifying a design rules description file for use with a general purpose shapes processing program. Design rule checking is the process for ensuring that VLSI masks are created according to the proper layout criteria. Specific design rule checks verify shape size, type, and proximity to adjacent shapes. The design rules checking (DRC) software is comprised of a design rules description file, called a runset, which is provided in the form of an input file to a general purpose shapes processing program (GPSPP). The runset uses a command language that instructs the processor executing the GPSPP how to perform the design rule checks.

Figure 1:
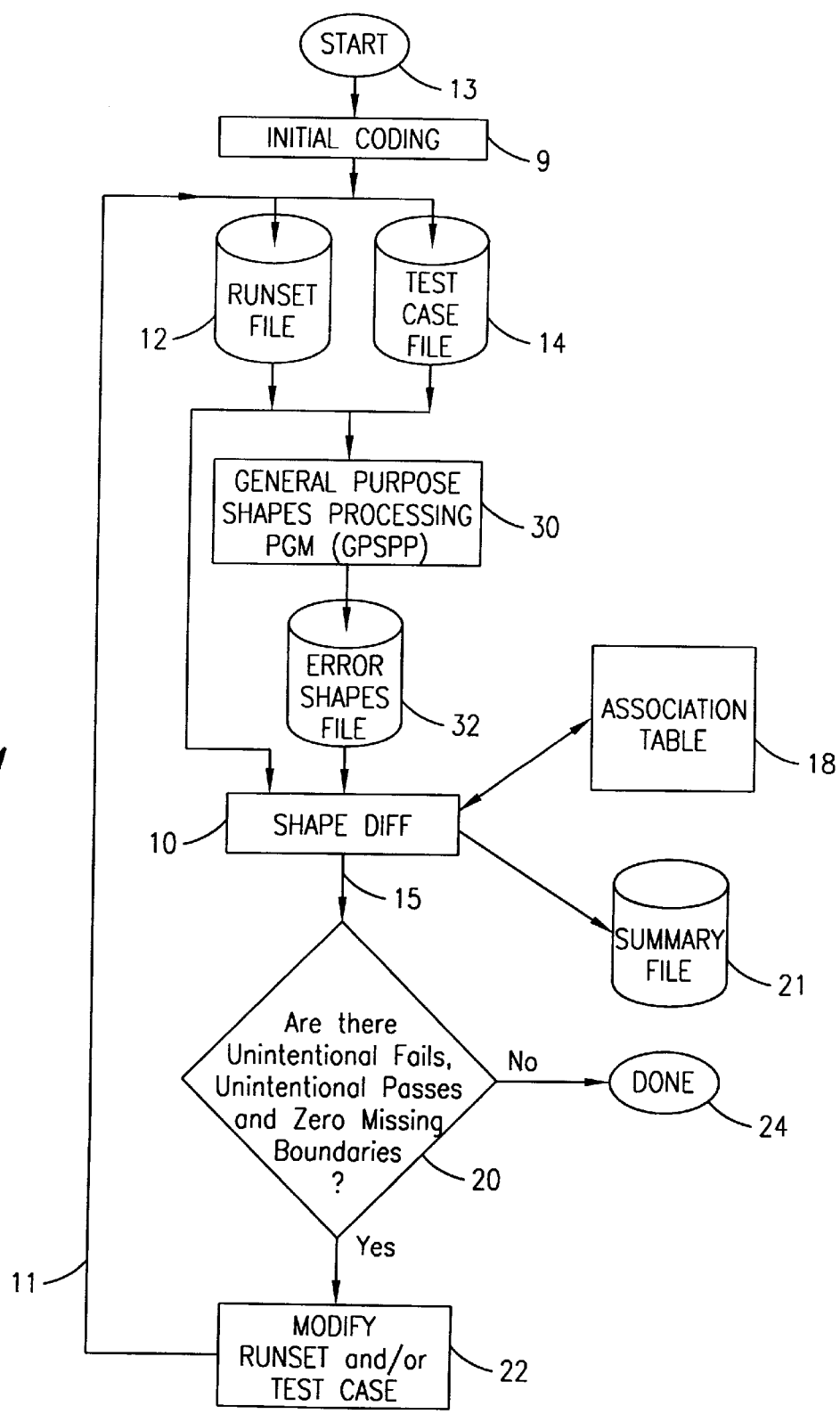
FIG. 1 is a flow diagram showing the generation and verification process and method for eliminating errors from the automated design rules description file according to the preferred embodiment of this invention.

Referring to FIG. 1, a generate-and-verify computer program called SHAPEDIFF 10 is provided to automate the verification process and removes any errors from the runsets for a given VLSI fabrication process. The process and method of the preferred embodiment eliminate both errors not detected by the runset and errors detected erroneously. FIG. 1 shows a flow chart of the generation and verification process for eliminating errors from the runset.

The process is started at START 13 with the initial coding 9 of the runset file 12 and the testcase file 14. These files 12, 14 are initially loaded from general purpose runset and testcase files which require adaption to a specific VLSI fabrication process. The testcase file 14 consists of groups of layout structures or shapes that collectively exercise all the design rules of the given VLSI fabrication process. The files 12 and 14 are input to a general purpose shapes processing program (GPSPP) 30, which processes the files 12,14 and creates error shapes file 32. The input data to the generation and verification software methodology, called SHAPEDIFF 10, receives three different software input files: runset file 12, testcase file 14, and error shapes file 32. SHAPEDIFF 10 creates association table 18 and summary file 21. SHAPEDIFF 10 generates an output 15 which defines whether it has detected any error conditions in runset file 12 and testcase file 14. Error conditions include unintentional fails, unintentional passes, and missing boundary (these error condition are defined in detail hereinafter). Decision block 20 determines whether any error conditions exist. If no errors conditions exist the generation of a modified runset (and/or testcase) is complete as denoted by DONE 24. If error conditions exist, the runset file 12 and/or testcase file 14 is modified by block 22. Block 22 is normally a manual operation, although it could be automated by another piece of software. The modified runset and testcase files 12, 14 are again run through the flow diagram starting each time with the loading the modified runset over interface 11 to runset file 12 and/or the modified testcase to testcase file 14.

Figure 2:
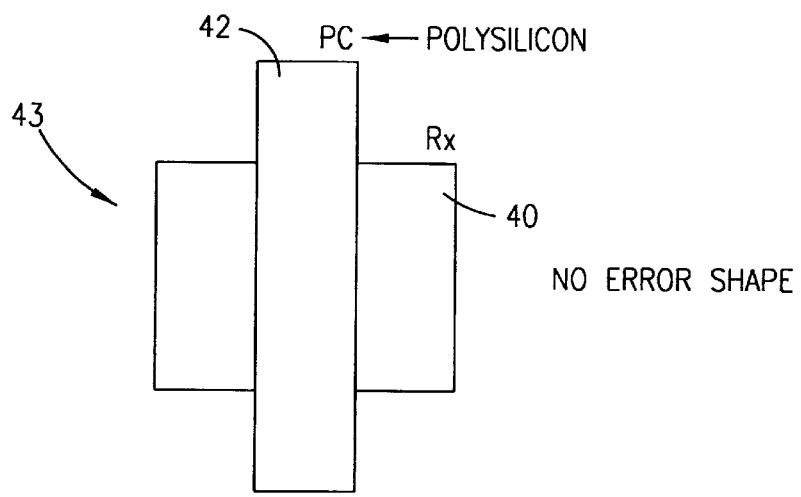
FIG. 2 shows an example of an integrated circuit layout structure having no errors according to the preferred embodiment of this invention.
Figure 3:
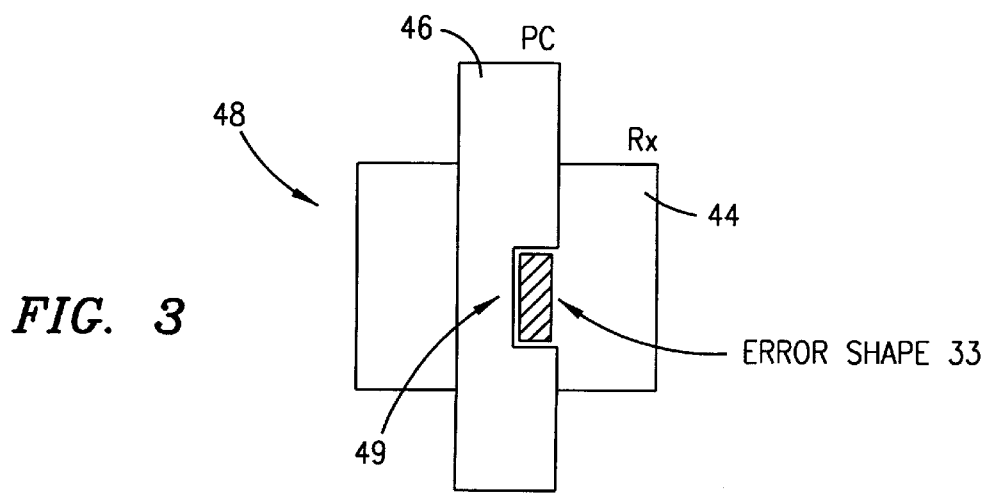
FIG. 3 shows an example of an integrated circuit layout structure having errors referred to as error shapes according to the preferred embodiment of this invention.

Referring to FIGS. 2 and 3, error shapes 33 typically represent "difference shapes" which are the difference between what is in the testcase file 14 and what the runset 12 is coded to check. FIGS. 2 and 3 show an example case where the runset contains the following pseudo-syntax:

"Width PC over RX>1.0 microns"

This pseudo-syntax means that the polysilicon (PC) of FIGS. 2 and 3 as it overlays diffusion section Rx should be greater than 1.0 microns in width. FIG. 2 shows an example of an integrated circuit layout structure having no errors. The circuit 43 is comprised of a section Rx 40, which is a section of diffusion, and PC 42, which is polysilicon. Sections 40 and 42 of circuit 43 are the proper shape, size, and type and, therefore, pass the design rule check and have no error shapes. FIG. 3 shows an example of an integrated circuit layout structure having errors referred to as error shapes. The circuit 48 is compromised of a section Rx 44, which is a section of diffusion, and PC 46, which is polysilicon. Section 46 is not the proper shape, because strip 49 is too thin to provide the 1.0 micron width required for circuit 48 to pass the design rule checks. Therefore, error shape 33 is created and defines the shape of the geometrical error in circuit 48. Error shape 33 is one particular error of the total file of error shapes 32.

Figure 4:
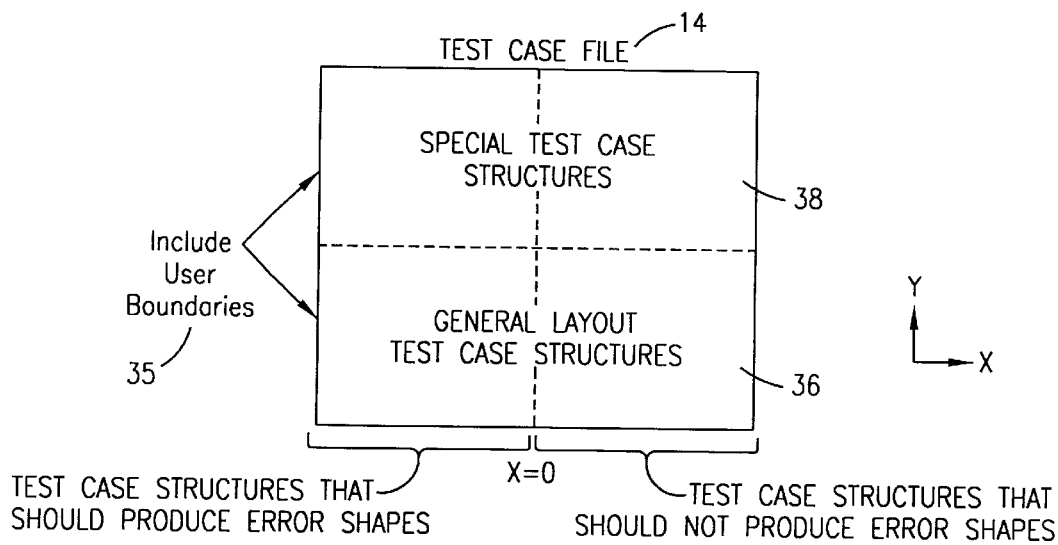
FIG. 4 is a diagram showing the spatial division of the testcase file into one section for general layout structures and one section for special layout structures according to the preferred embodiment of this invention.
Figure 6:
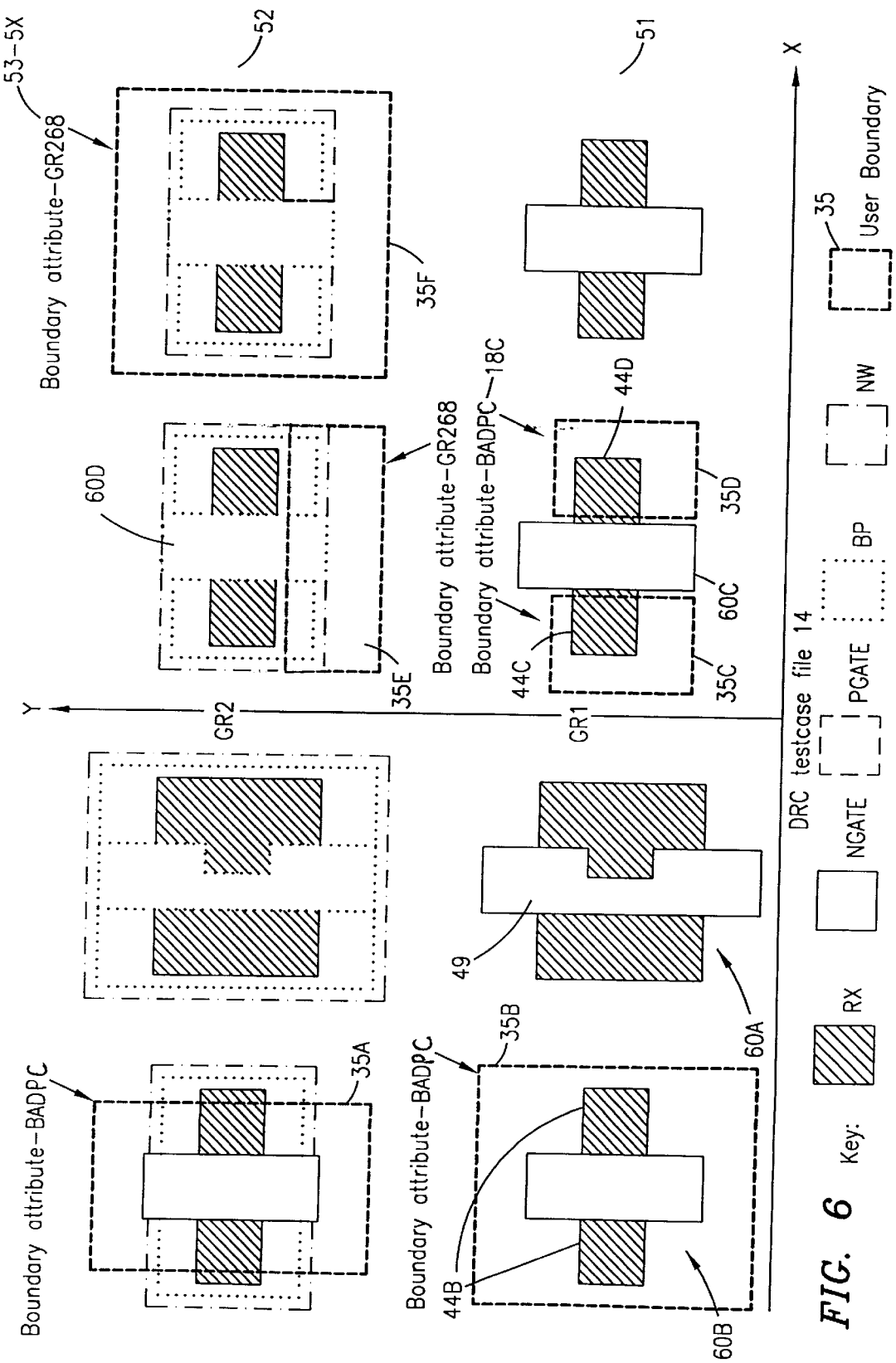
FIG. 6 is diagram showing the organization of the testcase file into horizontal rows and columns around the x axis and the y axis according to the preferred embodiment of this invention.

Referring to FIG. 1, the disclosed invention of generating and verifying a runset file 12 comprises SHAPEDIFF 10. The main iteration loop includes blocks 12, 14, 30, 32, 10, 20, and 22. SHAPEDIFF 10 receives input files from error shapes file 32, runset file 12, and testcase file 14. SHAPEDIFF 10 overlays error shapes file 32 with user boundary shapes 35. User boundary shapes 35 shown in FIG. 6 are part of testcase file 14 (user boundary shapes will be described in more detail hereinafter). FIG. 4 shows the spatial division of the testcase file 14 into one section 36 for general layout structures and one section 38 for special layout structures, where both sections 36,38 include user boundary shapes 35. The special layout structures 38 are culled from circuit designs and other sources that are known to stress certain design rules checking. The runset 12 finding an error shape 33 is a likely scenario since the runset 12 starts as a general purpose runset file, and SHAPEDIFF 10 is tailoring hat general runset to a particular VLSI fabrication process.

Besides error shapes 33, other shapes called boundary shapes are introduced to define regions where error shapes 33 can occur or where error shapes are masked to excuse errors. There are two types of boundaries: automated (auto) boundaries 31 and user boundaries 35. Auto boundaries 31 are automatically created by SHAPEDIFF 10. User boundary shapes 35 are described in testcase file 14.

Figure 5:
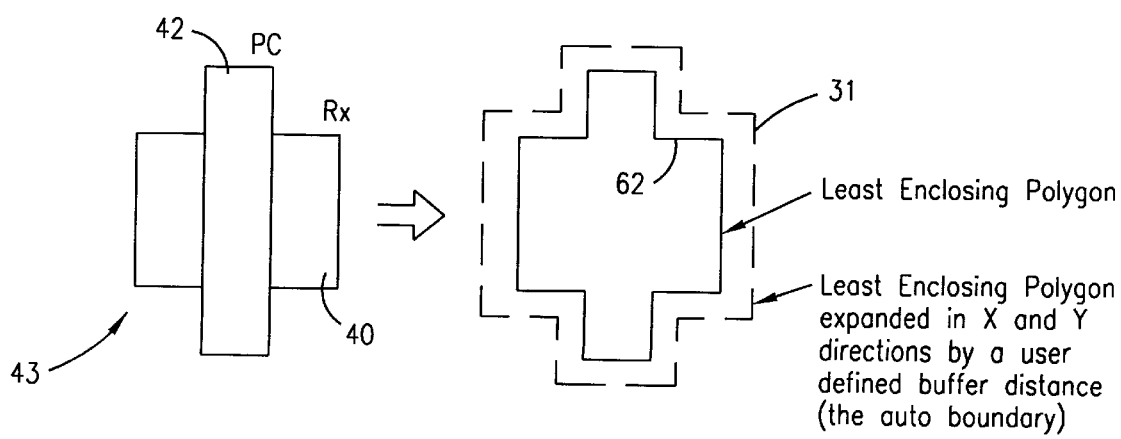
FIG. 5 is a diagram showing the method of generating of auto boundary shapes according to the preferred embodiment of this invention.

Referring to FIG. 5, the process for generating auto boundary shapes 31 is shown. Auto boundaries 31 are automatically created by SHAPEDIFF 10 from the least-enclosing polygon 62 for each test structure. For instance, the least-enclosing polygon for circuit 43 is the outline of the circuit. The least-enclosing polygon 62 is expanded slightly in both the x and y directions by a used-defined buffer distances to generate the auto boundary shape 31. SHAPEDIFF expects a text string on the same horizontal row with the test structures for a given ground rule (e.g., GR1). That text string is detected by its proximity to other test structures on that row and then assigned to all auto boundaries on that row.

Referring to FIG. 6, the testcase file 14 is organized in rows of test structures 60 on an x-y plane. Each row contains all test structures for a each groundrule; for instance, groundrule 1 (GR1) and groundrule 2 (GR2) are placed in horizontal rows 51, 52, respectively. In general the number of test structures 60 per rule varies between two to approximately twelve, although there is no limit on the number of test structures per row. The rows 51, 52 of test structures 60 are placed along the y-axis in an order that parallels the design rule sequencing in the manual defining the VLSI fabrication process. Test structures 60 are duplicated on both sides of the y-axis and modified from the layout structures such that the test structures for x>0 are intended to pass (produce no error shape), and those located x<0 are intended to fail (produce error shapes). Also shown in FIG. 6 are user boundary shapes 35 which are also resident in testcase file 14.

Figure 7:
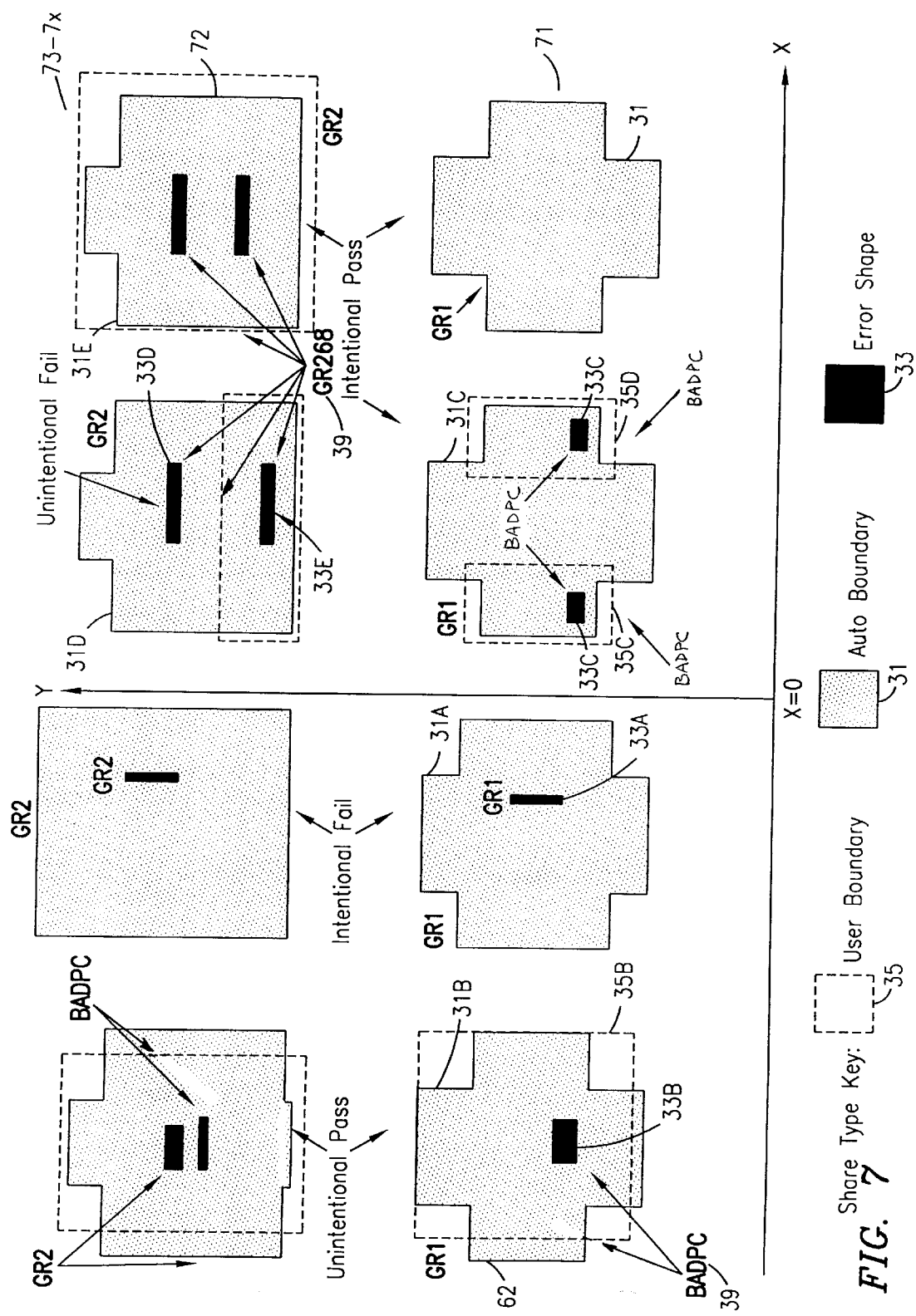
FIG. 7 is diagram showing the boundary and error shapes used to build the association table organized into horizontal rows and columns around the x axis and the y axis according to the preferred embodiment of this invention.

Referring to FIG. 7, a pictorial representation is shown of the shapes use by SHAPEDIFF 10 to build association table 18. FIG. 7 combines all three shapes (error shapes 33, user boundary shapes 35, and auto boundary shapes 31) relating to each test structure 60 of testcase file 14. A label string 39 of text located in each row 71, 72 is used as a shape attribute.

For some design rules, it is difficult to create a test structure 60 that uniquely flags only a single rule. To handle these cases, the user boundary shapes 35 of the testcase file 14 are provided to excuse all superfluous error shapes 33. User boundaries 35 can be added anywhere and also have a shape attribute that identifies the error shape 33 that should occur inside. Typical user boundaries 35 are shown as dashed rectangles in FIGS. 6 and 7.

Figure 8:
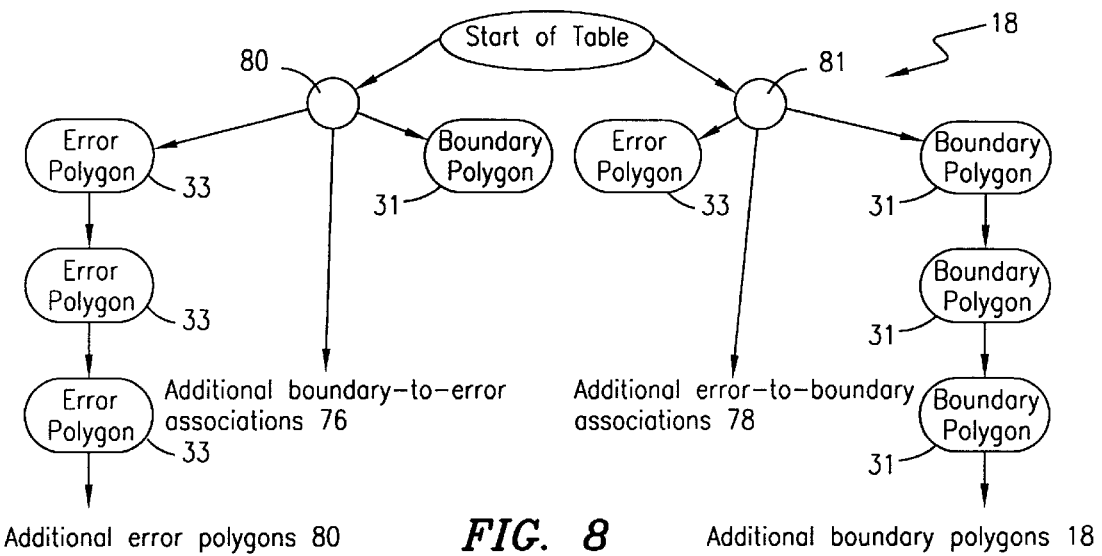
FIG. 8 is a diagram showing the process of building an association table to link error shapes and boundary shapes according to the preferred embodiment of this invention.
Figure 9:
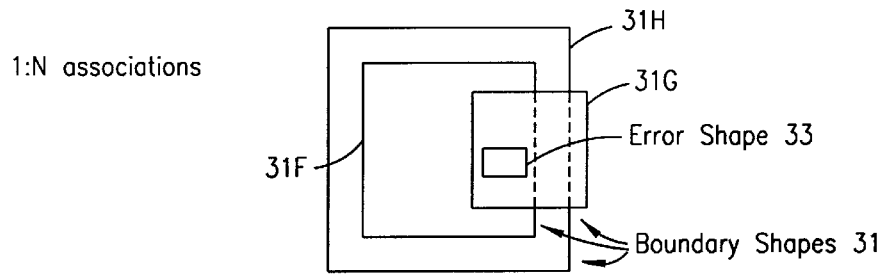
FIG. 9 shows an example of the 1:N associations between error shapes and boundary shapes, where one error shape is associated with N boundary shapes according to the preferred embodiment of this invention.
Figure 10:
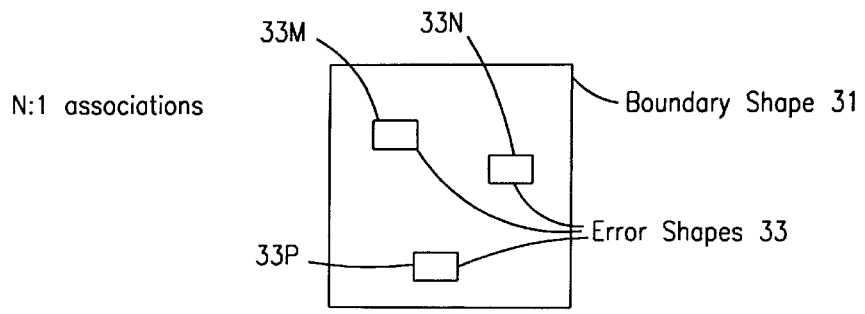
FIG. 10 shows an example of the N:1 associations between error shapes and boundary shapes, where N error shapes are associated with 1 boundary shape according to he preferred embodiment of this invention.

Using the error shapes 33 and the boundary shapes 31, 35, SHAPEDIFF 10 builds an association table 18 (shown in FIG. 1) of error-to-boundary and boundary-to-error spatial associations. Referring to FIG. 8, the process for building association table 18 is shown. The association table 18 is built by SHAPEDIFF 10 using polygon intersect operations. The association table consists of a 1 to N mapping of the spatial relations between each error shape 33 and all types of boundary shapes 31,35. Referring to FIG. 9, 1:N spatial associations are shown, where one error shape 33 is enclosed by N (3 shown) boundaries 31f, 31g, and 31h. Referring to FIG. 10, N:1 spatial associations are shown, where one boundary shape 31 encloses N (3 shown) error shapes 33m, 33n, and 33p. Spatial error/boundary comparisons are more reliable than other possible methods such as parsing ASCII DRC error listing files, because complex shape interactions between boundaries 31 and error shapes 33 can be handled. Once shape associations are stored in table 18 in this data structure, runset 12 accuracy can be easily verified by checking the shape attributes 39 stored in each error and boundary branch 80, 81 of the associations. There are five types of shapes relationships reported by SHAPEDIFF 10:

1. Intentional fail (a test structure 60 that is supposed to fail produces an error shape with an attribute hat matches the attribute or an adjacent boundary shape).
2. Intentional pass (a test structure 60 that is supposed to pass, which means it produces no error shape inside a boundary).
3. Unintentional fail (an error shade is found inside a boundary, but the error attribute does not match the boundary attribute).
4. Unintentional pass (a boundary where an error shapes is expected contains no error shape).
5. Missing boundary (an error shape was found without a boundary).

SHAPEDIFF 10 results are provided in a summary file 21 (FIG. 1) that lists the above categories, the shapes involved, a coordinate on the error/boundary shapes, and rule text (a description of the rule being checked found by parsing comment fields in the runset). A condensed summary is also provided: a successful verification run by SHAPEDIFF 10 gives zero unintentional passes, zero unintentional fails, and zero missing boundary errors. That is, if the russet 12 is functioning properly, it detects no errors that are not intentional. Note that error cases are purposely put in testcase file 14 (FIG. 4) to verify that runset 12 correctly detects errors; these errors are called intentional fails. If an intentional fail does not occur when it is supposed to, this is an error and must be corrected in step 22 of FIG. 1 (modify the runset file 12 and/or the testcase file 14). Likewise, cases without errors are purposely put in testcase file 14 to verify that runset 12 correctly detects no errors for these cases; these structures are called intentional passes. If an intentional pass does not occur when it is supposed to, this is also an error and must be corrected in step 22 also.

Referring again to FIGS. 6 and 7, rows 51, 52 contain test structures 60 and user boundary shapes 35 for a simplified testcase file 14. Rows 71, 72 show the association of auto boundary shapes 31, user boundary shapes 35, and error shapes 33. Rows 71 to 7X are produced as the result of several processing steps in SHAPEDIFF 10 that used rows 51 to 5X as inputs plus the SHAPEDIFF 10 generated auto boundary shapes 31. Rows 71, 72 represent pictorial views of the contents of association table 18.

The associations of FIGS. 6 and 7 are best understood by considering four examples. For example 1, auto boundary shape 31A in row 71 is compared with test structure 60A from row 51 as an example of an intentional fail case. Test structure 60A fails ground rule 1 because strip 49 of test structure 60A is too narrow to pass design rule check GR1. Since error shape 33A when overlaid by boundary shape 31A is totally included inside the boundary, SHAPEDIFF 10 detects error shape 33A as a valid error because the boundary and error attributes match on the fail side of the y-axis. Thus, the intentional fail case 31*a*, 33*a* is detected as an error as it should be and the design rules check passes for test structure 60.

For example 2, auto boundary shape 31B in row 71 is overlaid with test structure 60B from row 51 as an example of an unintentional pass case, because the user boundary excuses the error shape and no other error shape was found within the auto boundary. SHAPEDIFF 10 provides the option of having either the error shape totally enclosed or only touching a boundary. Example 2 uses the totally enclosed option. In example 2, the user has specified the use of user boundary shape 35B. The meaning here of user boundary shape 35*b* is to prevent the detection of errors internal to the boundary 35B. Thus, user boundary shape 35B overrides the error found and causes test structure 60*b* to pass the design rule check for GR1. This becomes an unintentional pass case 31B, 33B, 35*b*, because it is located on the X<0 side of the y-axis where tests are supposed to fail. This is an error and could result in modifying the runset in step 22 of FIG. 1. The modification could be to move the testcase to the other side of the y-axis so that it becomes an intentional pass case (such a modification would be in the testcase file 14 as opposed to the runset file 12).

For example 3, consider the other side of the y-axis for ground rule 1 (GR1), auto boundary shape 31C in row 71 is created from test structure 60C and user boundary shapes 35C and 35D from row 51, as an example of an intentional pass case. Since error shapes 33C, when overlaid by auto boundary shape 31C, are totally included inside auto boundary shape 31C, SHAPEDIFF 10 would normally detect error shapes 33C as a valid error, because the auto boundary shape 31C and error shapes 33 have attributes that match. However, the user has specified the use of user boundary shapes 35C and 35D. The meaning here of user boundary shapes 35C,D is to prevent the detection of errors internal to the boundary 35C,D. Thus, user boundary shape 35C,D overrides the error found and causes test structure 60C to pass the design rule check for GR1. This becomes an intentional pass case 31C, 33C, 35C, 35D, because it is located on the X>0 side of the y-axis where tests are supposed to pass.

For the final example, boundary 31D in row 72 is created from test structure 60D from row 52 as an example of an unintentional fail case. Runset 12 detects error shapes 33D,E in test structure 60D in relation to ground rule 2 (GR2). Auto boundary 31D shows error shapes 33D,E inside the boundary 31D. Error shape 33E is excused by user boundary 35E. However, error shape 33D is not excused, is internal to auto boundary 31D, and is a valid error. The valid error shape 33D causes test structure 60D to fail. This becomes an unintentional fail case 31D, 33D, 35D, because it is located on the X>0 side of the y-axis where tests are supposed to pass. This is an error and will result in SHAPEDIFF 10 generating outputs which are used to manually modify the runset in step 22 of FIG. 1 to correct this problem in the next iteration of FIG. 1.

Missing boundaries are defined as error shapes that are not surrounded by any type of boundary.

Rows 52, 72 and multiple rows 53–5X and 73–7X are extensions to check other groundrules with each added row checking a further design rule of the VLSI fabrication process. These additional rows all function in a manner similar to rows 51, 71 for detecting the five categories of errors: intentional fail, intentional pass, unintentional LD fail, unintentional pass, and missing boundary. SHAPEDIFF 10 continues to provide an output for the purpose of modifying the runset 12 in step 22 of FIG. 1 until a run is obtained that has zero unintentional fails, zero unintentional passes, and zero missing boundaries for all ground rules. The final version of the runset 12 becomes the design rules checking file for exhaustively testing VLSI chips for compliance to the design rules of said VLSI fabrication process.

In summary, SHAPEDIFF 10 performs the following functions in the following order:

1) Reads runset file 12 for rule descriptions;
2) Reads error shapes file 32;
3) Reads testcase file 14;
4) Generates auto boundary shapes 31;

5) Propagates text strings to attributes;

6) Builds association table 18;

7) Traverses association table 18 looking for pass/fail conditions; and

8) Generates summary file 21.

The advantage of this invention is that an automated method for establishing the correctness of each design rules description file (runset) is provided such that the design rules checking program using the runset will detect all error conditions.

It is a further advantage of this invention that an automated method for establishing the correctness of each runset such that the design rules checking program using the runset will not falsely flag non-existent error conditions.

It is a further advantage of this invention that a software methodology is provided for generating runsets to replace the prior art method of manually generating the runsets.

It is a further advantage of this invention that a method is provided for classifying testcases using relationships that include intentional pass, intentional fail, unintentional pass, and unintentional fail configurations.

It is a further advantage of this invention that a method is provided for using boundary shapes to surround each test structure and define regions wherein errors could occur or are excused from occurring.

It is a further advantage of this invention that a method is provided for the automated creation of the boundary shapes.

It is a further advantage of this invention that a method is provided for using an association table for describing the relationships between the boundary shapes and error shapes such that software complexity is reduced.

It will be appreciated that, although the specific embodiment of the invention has been described herein for purposes of illustration, various modifications can be made without departing from the spirit and scope of the invention. Other applications would be using SHAPEDIFF in any application where there are mechanical drawings that use fixed design rules and are layout-verified by some software program that generates error shapes. This includes architectural plans, mechanical schematics, and other applications.

Accordingly, the scope of protection of this invention is limited only by the following claims and their equivalents.

What is claimed is:

1. A computer program product for use in generating a runset file comprising design rule descriptions in a command language for very large scale integrated (VLSI) fabrication processes by defining modifications for a general purpose runset file, wherein said runset file is processed by a general purpose shapes processing program for checking specific VLSI chip designs in said VLSI fabrication process for violations of the design rules, comprising:

a recording medium readable by a computer;

means recorded on said recording medium for directing the computer to input said general purpose runset file to said general purpose shapes processing program;

means for inputting a testcase file, wherein said testcase file is comprised of groups of layout structures and user defined boundary shapes for exhaustively testing said runset;

means for executing said runset software for checking said testcase file and creating an error shapes file, wherein said error shapes file comprises a plurality of design rule errors detected by said general purpose shapes processing program, the error format providing the shape of the geometrical error found in each said layout structure;

means for inputting an error shapes file;

means for inputting a plurality of user boundary shapes stored in said testcase file for defining to said computer program areas internal to said user boundary shapes in which errors are not to be detected for a given design rule;

means for generating a plurality of automated boundary shapes by said computer program product, each automated boundary shape to surround a respective one of said layout structures with a boundary that slightly exceeds the least-enclosing polygon shape for said layout structure and defines regions where error shapes could occur;

means for generating an association table by said computer program product, wherein said association table is a compilation of the error shapes, user boundary shapes, and automated boundary shapes associated with each said layout structure;

means for processing said associations stored in said association table for determining if each said error shape is a valid error or not;

means for defining the modification to runset file and/or testcase file for each valid error shape detected, whereby said runset is modified either manually or by special purpose software to correct each erroneous check of said design rules; and means for saving said modified runset file to input back into said computer program product for verifying said modifications and for detecting further error shapes.

2. The computer program product of claim 1 wherein the modified runset further comprises a means for saving the final version of said modified runset for repetitive use of said final version to exhaustively test integrated circuit chips for compliance to the design rules of said technology.

3. The computer program product of claim 2 wherein the testcase file further comprises a means for providing special layout structures, wherein special layout structures are culled from circuit designs and other sources that are known to stress certain design rules for checking.

4. The computer program product of claim 3 wherein the testcase file further comprises a subdivision means for modifying and subdividing each layout structure into two test structures providing a first test structure designed to fail the rule check provided by the runset and a second test structure designed to pass the rule check provided by said runset.

5. The computer program product of claim 4 wherein the testcase file further comprises a means for structuring the rule checks, wherein all said first and second test structures for testing a given design rule are structured into a horizontal row on a two-dimensional x, y axis, where said first test structures designed to fail are placed on the x<0 side of the y-axis and said second test structures designed to pass are placed on the x>0 side of the y-axis.

6. The computer program product of claim 5, further comprising a means for categorizing test structures that fail into the five categories as follows:

intentional fail category for classifying a first test structure that is designed to fail and fails the design rule check;

intentional pass category for classifying a second test structure that is designed to pass and passes the design rule check;

unintentional fail category for classifying a second test structure that is designed to pass but instead fails the design rule check;

unintentional pass category for classifying a first test structure that is designed to fail but instead passes the design rule check; and missing boundary category for classifying an error shape having no automated boundary shape.

7. The computer program product of claim 6, further comprising a means for detecting when a modified runset has no unintentional fails, no unintentional passes, and no missing boundaries for saving that modified runset software as the final version of the runset for exhaustive testing of VLSI chips for compliance to the design rules of said VLSI fabrication process.

8. The computer program product of claim 7, further comprising a summary file for listing each detected error, the error category, the shapes involved, and the design rule being verified.

9. The computer program product of claim 1 wherein the testcase file further comprises text strings which are propagated by said computer program product to generate attributes.

10. The computer program product of claim 9 wherein the association table further comprises error-boundary associations that are generated by checking said attributes for each said test structure.

11. A first computer program product for categorizing the results of executing a second computer program product and for verifying the correctness of said second computer program product and a runset file, said first computer product comprising:

a recording medium readable by a computer;

means recorded on said recording medium for directing the computer to input the results of executing said second computer program product with respect to said runset file said runset file comprised of a plurality of rule descriptions and a testcase file comprised of a plurality of test structures;

means for classifying a test structure that is supposed to fail and does fail as an intentional fail;

means for classifying a test structure that is supposed to pass and does pass as an intentional pass;

means for classifying a test structure that is supposed to pass but instead fails as an unintentional fail; and means for classifying a test structure that is supposed to fail but instead passes as an unintentional pass.

12. A method for generating a runset file for a VLSI fabrication process from a general purpose runset file for checking VLSI chip designs in said VLSI fabrication process for violations of the design rules, comprising the steps of:

inputting said general purpose runset file;

inputting a testcase file, wherein said testcase file is comprised of groups of layout structures or shapes for exhaustively testing said runset to verify that all the design rules of said VLSI fabrication process are exhaustively checked;

executing a general purpose shapes processing program using said runset file for checking said testcase file and creating an error shapes file, wherein said error shapes file comprises a plurality of design rule errors, where the error format provides the shape of the geometrical error found in each said layout structure;

inputting an error shapes file;

inputting a plurality of user boundary shapes, wherein said user boundary shapes are for defining areas internal to said user boundary shapes in which errors are not to be detected for a given design rule;

creating automated boundary shapes to surround each said layout structure with a boundary that slightly exceeds the least-enclosing polygon shape and defines regions where error shapes could occur;

generating an association table, wherein said association table is a compilation of the error shapes, user boundary shapes, and automated boundary shapes associated with each said layout structure;

processing said associations stored in said association table for determining if each said error shape is a valid error or not;

modifying said runset file and/or testcase file for each valid error shape detected, wherein said runset or testcase is modified to correct each erroneous check of said design rules; and inputting said modified runset file back into the beginning step of said method for verifying said modifications and for detecting of further error shapes.

13. The method of claim 12, further comprising the step of storing said modified runset after each iteration through said method, said storing step for saving said modified runset file as the final version of runset for repetitive use of said final version to exhaustively test VLSI chips for compliance to the design rules of said VLSI fabrication process.

14. The method of claim 13, wherein the step of modifying said runset file is provided either manually or by special purpose software.

15. The method of claim 14, further comprising the step of subdividing each layout structure into a first test structure designed to fail the rules check of said runset and a second test structure designed to pass the rules check provided of said runset.

16. The method of claim 15, further comprising the step of structuring the rule checks, wherein all said first and second test structures for testing a given design rule are subdivided into a horizontal row on a two-dimensional x,y axis, where said first test structures designed to fail are placed on the x<0 side of the y-axis and said second test structures designed to pass are placed on the x>0 side of the y-axis.

17. The method of claim 16, further comprising the step of categorizing test structure failures into the five categories as follows:

intentional fail category for classifying a first test structure that is designed to fail and fails the design rule check;

intentional pass category for classifying a second test structure that is designed to pass and passes the design rule check;

unintentional fail category for classifying a second test structure that is designed to pass but instead fails the design rule check;

unintentional pass category for classifying a first test structure that is designed to fail but instead passes the design rule check; and missing boundary category for classifying an error shape having no boundary shape.

18. The method of claim 17, further comprising the step of detecting when a modified runset has no unintentional fails, no unintentional passes, and no missing boundaries for saving that runset as the final version for exhaustive testing of integrated circuit chips for compliance to the design rules of said VLSI fabrication process.

19. The method of claim 18, further comprising the step of generating a summary file for listing at least the following: each detected error, the error category, the shapes involved, and the design rule being violated.

20. A method of structuring a testcase file, comprising the steps of:

subdividing each layout structure from said testcase file, said testcase file comprised of a plurality of layout structures for verifying a design rules checking computer program into two test structures and providing a first test structure designed to fail the rules check and a second test structure designed to pass the rules check;

structuring all said first and second test structures for testing a given design rule into a horizontal row on a two-dimensional x,y axis, where said first test structures that are intended to fail are placed on the x<0 side of the y-axis and said second test structures that are intended to pass are placed on the x>0 side of the y-axis; and categorizing test structure fails and passes after the execution of said design rules checking computer program into the five categories as follows:

intentional fail category for classifying a first test structure that is supposed to fail and fails the design rule check;

intentional pass category for classifying a second test structure that is supposed to pass and passes the design rule check;

unintentional fail category for classifying a second test structure that is supposed to pass but instead fails the design rule check;

unintentional pass category for classifying a first test structure that is supposed to fail but instead passes the design rule check; and missing boundary category for classifying an error shape having no automated boundary shape or user boundary shape.

21. A method of categorizing the results of a first computer program when executed to verify a second computer program, comprising the steps of:

inputting a test case file from said second computer program, said testcase file comprised of a plurality of test structures and a runset file for describing design rules;

classifying a test structure that is supposed to fail and does fail as an intentional fail;

classifying a test structure that is supposed to pass and does pass as an intentional pass;

classifying a test structure that is supposed to pass but instead fails as an unintentional fail; and classifying a test structure that is supposed to fail but instead passes as an unintentional pass.

22. A method for generating and verifying a design rules description file as automated by a generate-and-verify computer program product, said method comprising the steps of:

reading a runset file for rule descriptions;
    reading error shapes file for specifying design rule errors;
    reading a testcase file for defining test structure layout and text strings;
    generating automatic boundary shapes for surrounding each test structure;
    propagating text strings to attributes;
    building an association table of relationship between error shapes and boundary shapes;
    traversing said association table looking for pass/fail error conditions; and
    generating a summary file.

23. A runset on computer media used in design rule checking, which is generated through the method comprising:

inputting a general purpose runset file;

inputting a testcase file, wherein said testcase file is comprised of groups of layout structures or shapes for exhaustively testing said runset to verify that all the design rules of a VLSI fabrication process are exhaustively checked;

executing a general purpose shapes processing program using said runset file for checking said testcase file and creating an error shapes file, wherein said error shapes file comprises plurality of design rule errors, where the error format provides the shape of the geometrical error found in each said layout structure;

inputting an error shapes file;

inputting a plurality of user boundary shapes, wherein said user boundary shapes are for defining areas internal to said user boundary shapes in which errors are not to be detected for a given design rule;

creating automated boundary shapes to surround each said layout structure with a boundary that slightly exceeds the least-enclosing polygon shape and defines regions where error shapes could occur;

generating an association table, wherein said association table is a compilation of the error shapes, user boundary shapes, and automated boundary shapes associated with each said layout structure;

processing said associations stored in said association table for determining if each said error shape is a valid error or not;

modifying said runset file and/or testcase file for each valid error shape detected, wherein said runset or testcase is modified to correct each erroneous check of said design rules; and inputting said modified runset file back into the beginning step of said method for verifying said modifications and for detecting of further error shapes.

24. The runset of claim 23, further comprises wherein the method step of storing said modified runset after each iteration through said method, said storing step for saving said modified runset file as the final version of runset for repetitive use of said final version to exhaustively test VLSI chips for compliance to the design rules of said VLSI fabrication process.

25. The runset file of claim 23 wherein the step of modifying said runset file is provided either manually or by special purpose software.

26. The runset of claim 25, further comprises wherein the method step of subdividing each layout structure into a first test structure designed to fail the rules check of said runset and a second test structure designed to pass the rules check provided of said runset.

27. The runset of claim 26, further comprises wherein the method step of structuring the rule checks, wherein all said first and second test structures for testing a given design rule are subdivided into a horizontal row on a two-dimensional x,y axis, where said first test structures designed to fail are placed on the x<0 side of the y-axis and said second test structures designed to pass are placed on the x>0 side of the y-axis.

28. The runset of claim 27, further comprises wherein the method step of categorizing test structure failures into the five categories as follows:

intentional fail category for classifying a first test structure that is designed to fail and fails the design rule check;

intentional pass category for classifying a second test structure that is designed to pass and passes the design rule check;

unintentional fail category for classifying a second test structure that is designed to pass but instead fails the design rule check;

unintentional pass category for classifying a first test structure that is designed to fail but instead passes the design rule check; and missing boundary category for classifying an error shape having no boundary shape.

29. The runset of claim 28, further comprises wherein the method step of detecting when a modified runset has no unintentional fails, no unintentional passes, and no missing boundaries for saving that runset as the final version for exhaustive testing of integrated circuit chips for compliance to the design rules of said VLSI fabrication process.

30. The runset of claim 29, further comprises wherein the method step of generating a summary file for listing at least the following: each detected error, the error category, the shapes involved, and the design rule being violated.

* * * * *